United States Patent
Lee et al.

(10) Patent No.: US 10,063,198 B2
(45) Date of Patent: Aug. 28, 2018

(54) TERMINAL DEVICE, AND SIGNAL SENDING METHOD AND APPARATUS

(71) Applicant: Huawei Technologies Co., Ltd., Shenzhen (CN)

(72) Inventors: Fang-Ching Lee, Shanghai (CN); Yanhui Ren, Tampere (FI); Fushun Chen, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/555,349

(22) PCT Filed: Mar. 11, 2015

(86) PCT No.: PCT/CN2015/074006
§ 371 (c)(1),
(2) Date: Sep. 1, 2017

(87) PCT Pub. No.: WO2016/141571
PCT Pub. Date: Sep. 15, 2016

(65) Prior Publication Data
US 2018/0041178 A1    Feb. 8, 2018

(51) Int. Cl.
*H03F 3/217* (2006.01)
*H04R 29/00* (2006.01)
*H03F 3/68* (2006.01)

(52) U.S. Cl.
CPC .......... *H03F 3/2175* (2013.01); *H03F 3/68* (2013.01); *H04R 29/00* (2013.01); *H04R 2420/05* (2013.01)

(58) Field of Classification Search
CPC ....................................................... H03F 3/217
(Continued)

(56) References Cited

U.S. PATENT DOCUMENTS 8,487,249 B2 *  7/2013  Gershman ........... H01J 49/4275
                                                    250/282
2006/0159292 A1  7/2006  Guilbert
(Continued)

FOREIGN PATENT DOCUMENTS

CN         2919444 Y      7/2007
CN         101103505 A    1/2008
(Continued)

*Primary Examiner* — Henry Choe
(74) *Attorney, Agent, or Firm* — Leydig, Voit & Mayer, Ltd.

(57) ABSTRACT

A terminal device includes: an access unit, connected between a headset or an audio speaker and a digital-to-analog converter, and configured for insertion of a detachable second power amplifier; a processor, configured to: detect whether the second power amplifier is inserted into the access unit, output a first digital signal when detecting that the second power amplifier is inserted, and output a second digital signal when detecting that the second power amplifier is not inserted; the digital-to-analog converter, connected to the processor, and configured to: when receiving the first digital signal, convert the first digital signal to a first analog signal, and send the first analog signal to the second power amplifier; and when receiving the second digital signal, convert the second digital signal to a second analog signal, and send the second analog signal to a first power amplifier.

18 Claims, 3 Drawing Sheets

(58) Field of Classification Search
USPC .................................. 330/251, 124 R, 295
See application file for complete search history.

(56) References Cited

U.S. PATENT DOCUMENTS

| | | | |
|---|---|---|---|
| 2007/0139245 A1* | 6/2007 | Kimura | H03M 1/1205 |
| | | | 341/155 |
| 2011/0058692 A1* | 3/2011 | Huang | H03F 1/305 |
| | | | 381/120 |
| 2012/0294454 A1 | 11/2012 | Sakamoto et al. | |

FOREIGN PATENT DOCUMENTS

| | | |
|---|---|---|
| CN | 101494809 A | 7/2009 |
| CN | 104348945 A | 2/2015 |
| EP | 1006650 A2 | 6/2000 |
| KR | 20020095956 A | 12/2002 |

\* cited by examiner

Sending device 600

US 10,063,198 B2

TERMINAL DEVICE, AND SIGNAL SENDING METHOD AND APPARATUS

CROSS-REFERENCE TO RELATED APPLICATIONS

This application is a national stage of International Application No. PCT/CN2015/074006, filed on Mar. 11, 2015 which is hereby incorporated by reference in its entirety.

TECHNICAL FIELD

The present disclosure relates to the field of mobile communications, and in particular, to a terminal device, and a signal sending method and apparatus.

BACKGROUND

As high fidelity (HIFI) technologies of mobile phones become popular, users hope to pair headsets with sound sources of terminal devices by themselves, to achieve an optimal effect.

In the prior art, a preset power amplifier (PA) is mounted on a terminal device. Therefore, when the terminal plays audio, an audio stream can only select a built-in PA channel, to achieve a preset HIFI audio effect, that is, different HIFI effects cannot be achieved.

As can be learned from the above, the prior art has a problem that a terminal device can support only one type of PA, affecting user experience.

SUMMARY

Embodiments of the present disclosure provide a terminal device, and a signal sending method and apparatus, so as to resolve a problem in the prior art that a terminal device can support only one type of PA, affecting user experience.

According to a first aspect, a terminal device is provided, where the terminal device includes:

an access unit, a processor, a digital-to-analog converter, a built-in first power amplifier, and a detachable second power amplifier; where the access unit is connected between a headset or an audio speaker and the digital-to-analog converter, and is configured for insertion of the detachable second power amplifier;

the processor is configured to: detect whether the second power amplifier is inserted into the access unit; output a first digital signal when detecting that the second power amplifier is inserted into the access unit; and output a second digital signal when detecting that the second power amplifier is not inserted into the access unit; and the digital-to-analog converter is connected to the processor, and is configured to: when receiving the first digital signal, convert the first digital signal to a first analog signal, and send the first analog signal to the second power amplifier; and when receiving the second digital signal, convert the second digital signal to a second analog signal, and send the second analog signal to the first power amplifier.

With reference to the first aspect, in a first implementation manner of the first aspect, when detecting that the second power amplifier is inserted into the access unit, the processor is further configured to: receive a second power amplifier selection instruction entered by a user, where the second power amplifier selection instruction is used to trigger the processor to detect a power supply status of the second power amplifier; and output the first digital signal when the power supply status of the second power amplifier is a normal state.

With reference to the first aspect, in a second implementation manner of the first aspect, the processor is further configured to: receive a first power amplifier selection instruction entered by a user, and output the second digital signal according to the first power amplifier selection instruction.

With reference to the first aspect, the first implementation manner of the first aspect, or the second implementation manner of the first aspect, in a third implementation manner of the first aspect, the access unit is a male connector, the male connector is provided with pins, and the second power amplifier is a pin power amplifier.

With reference to the first aspect, the first implementation manner of the first aspect, or the second implementation manner of the first aspect, in a fourth implementation manner of the first aspect, the access unit is a secure digital SD card socket, where the SD card socket is provided with pins; the second power amplifier includes: a substrate, and a power amplifier disposed on the substrate; pins on the substrate are connected to the pins on the SD card socket after the substrate is plug-connected to the SD card socket.

With reference to the fourth implementation manner of the first aspect, in a fifth implementation manner of the first aspect, the power amplifier is disposed on the substrate by using a surface-mount technology SMT, where the pins on the substrate are edge connectors.

According to a second aspect, a signal sending method is provided, where the method includes:

detecting, by a processor, whether a detachable second power amplifier is inserted into an access unit;

sending a first digital signal to a digital-to-analog converter when it is detected that the second power amplifier is inserted into the access unit, so that the digital-to-analog converter converts the first digital signal to a first analog signal, and sends the first analog signal to the second power amplifier; and sending a second digital signal to the digital-to-analog converter when it is detected that the second power amplifier is not inserted into the access unit, so that the digital-to-analog converter converts the second digital signal to a second analog signal, and sends the second analog signal to a first power amplifier.

With reference to the second aspect, in a first implementation manner of the second aspect, when it is detected that the second power amplifier is inserted into the access unit, the method further includes:

receiving a second power amplifier selection instruction entered by a user, where the second power amplifier selection instruction is used to trigger the processor to detect a power supply status of the second power amplifier; and sending the first digital signal to the digital-to-analog converter when the power supply status of the second power amplifier is a normal state.

With reference to the second aspect, in a second implementation manner of the second aspect, the method further includes: receiving a first power amplifier selection instruction entered by a user, and sending the second digital signal to the digital-to-analog converter according to the first power amplifier selection instruction.

With reference to the second aspect, the first implementation manner of the second aspect, or the second implementation manner of the second aspect, in a third implementation manner of the second aspect, the access unit is a male connector, the male connector is provided with pins, and the second power amplifier is a pin power amplifier.

With reference to the second aspect, the first implementation manner of the second aspect, or the second implementation manner of the second aspect, in a fourth implementation manner of the second aspect, the access unit is a secure digital SD card socket, where the SD card socket is provided with pins; the second power amplifier includes: a substrate, and a power amplifier disposed on the substrate; pins on the substrate are connected to the pins on the SD card socket after the substrate is plug-connected to the SD card socket.

With reference to the fourth implementation manner of the second aspect, in a fifth implementation manner of the second aspect, the power amplifier is disposed on the substrate by using a surface-mount technology SMT, where the pins on the substrate are edge connectors.

According to a third aspect, a signal sending apparatus is provided, where the apparatus includes: an access unit, a detection unit, and a sending unit; where the access unit is configured for insertion of a detachable second power amplifier;

the detection unit is configured to detect whether the detachable second power amplifier is inserted into the access unit;

the sending unit is configured to send a first digital signal to a digital-to-analog converter when the detection unit detects that the second power amplifier is inserted into the access unit, so that the digital-to-analog converter converts the first digital signal to a first analog signal, and sends the first analog signal to the second power amplifier; and the sending unit is further configured to send a second digital signal to the digital-to-analog converter when the detection unit detects that the second power amplifier is not inserted into the access unit, so that the digital-to-analog converter converts the second digital signal to a second analog signal, and sends the second analog signal to a first power amplifier.

With reference to the third aspect, in a first implementation manner of the third aspect, the apparatus further includes: a receiving unit, configured to: receive a second power amplifier selection instruction entered by a user, where the second power amplifier selection instruction is used to trigger the detection unit to detect a power supply status of the second power amplifier; and send the first digital signal to the digital-to-analog converter when the power supply status of the second power amplifier is a normal state.

With reference to the third aspect, in a second implementation manner of the third aspect, the receiving unit is further configured to: receive a first power amplifier selection instruction entered by a user, and send the second digital signal to the digital-to-analog converter according to the first power amplifier selection instruction.

With reference to the third aspect, the first implementation manner of the third aspect, or the second implementation manner of the third aspect, in a third implementation manner of the third aspect, the access unit is a male connector, the male connector is provided with pins, and the second power amplifier is a pin power amplifier.

With reference to the third aspect, the first implementation manner of the third aspect, or the second implementation manner of the third aspect, in a fourth implementation manner of the third aspect, the access unit is a secure digital SD card socket, where the SD card socket is provided with pins; the second power amplifier includes: a substrate, and a power amplifier disposed on the substrate; pins on the substrate are connected to the pins on the SD card socket after the substrate is plug-connected to the SD card socket.

With reference to the fourth implementation manner of the third aspect, in a fifth implementation manner of the third aspect, the power amplifier is disposed on the substrate by using a surface-mount technology SMT, where the pins on the substrate are edge connectors.

According to a fourth aspect, a signal sending device is provided, where the sending device includes:

a processor, a memory, a communications interface, and a bus, where the processor, the memory, and the communications interface communicate with each other by using the bus;

the communications interface is configured to communicate with another device;

the memory is configured to store a program; and when the sending device is running, the processor is configured to execute the program stored in the memory, to perform the signal sending method according to the second aspect.

The embodiments of the present disclosure provide a terminal device, and a signal sending method and apparatus. The terminal device includes: an access unit, a processor, a digital-to-analog converter, a built-in first power amplifier, and a detachable second power amplifier, where the access unit is connected between a headset or an audio speaker and the digital-to-analog converter, and is configured for insertion of the detachable second power amplifier; the processor is configured to detect whether the second power amplifier is inserted into the access unit, output a first digital signal when detecting that the second power amplifier is inserted into the access unit, and output a second digital signal when detecting that the second power amplifier is not inserted into the access unit; and the digital-to-analog converter is connected to the processor, and is configured to: when receiving the first digital signal, convert the first digital signal to a first analog signal, and send the first analog signal to the second power amplifier; and when receiving the second digital signal, convert the second digital signal to a second analog signal, and send the second analog signal to the first power amplifier. In this way, the terminal device may be compatible with multiple PAs, so that users of the terminal device may pair different headsets with different sound sources by themselves, improving user experience.

DESCRIPTION OF EMBODIMENTS

The technical solutions of the present disclosure are further described in detail with reference to accompanying drawings and embodiments as follows:

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

To provide thorough understanding of the embodiments of the present disclosure, the following further describes specific embodiments in detail with reference to the accompanying drawings. The foregoing embodiments are not intended to limit the protection scope of the present disclosure.

The terminal device provided in the present disclosure may be a mobile terminal such as a mobile phone, a notebook computer, or a tablet computer.

Figure 1:
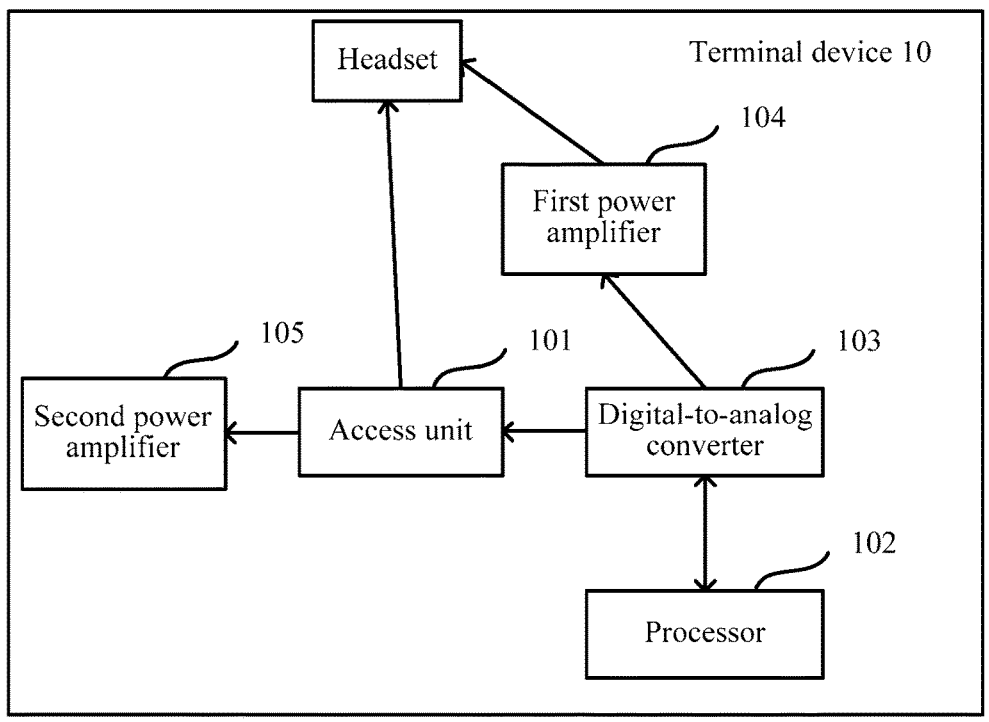
FIG. 1 is a first schematic diagram of a terminal device according to a first embodiment of the present disclosure.

FIG. 1 is a first schematic diagram of a terminal device according to a first embodiment of the present disclosure. In FIG. 1, the terminal device 10 includes: an access unit 101, a processor 102, a digital-to-analog converter 103, a built-in first power amplifier 104, and a detachable second power amplifier 105.

As shown in FIG. 1, the access unit 101 is connected between a headset or an audio speaker and the digital-to-analog converter 103, and is configured for insertion of the detachable second power amplifier 105. The access unit 101 may be a male connector 1011, or a secure digital (SD) card socket 1012. The processor 102 may be an application processor (AP), which is connected to the digital-to-analog converter 103. That is, the processor 102 may receive a digital signal from the digital-to-analog converter 103, or may send a digital signal to the digital-to-analog converter 103. The digital-to-analog converter 103 may be a digital-to-analog converter (DAC) chip, which is connected to both the access unit 101 and the first power amplifier 104. That is, the digital-to-analog converter 103 converts the digital signal received from the processor 102, and sends, to the first power amplifier 104, an analog signal obtained after the conversion. Alternatively, after the second power amplifier 105 is inserted into the access unit 101, the digital-to-analog converter 103 sends, to the second power amplifier 105, an analog signal obtained after the conversion. Finally, the first power amplifier 104 or the second power amplifier 105 forwards the analog signal to the headset or audio speaker, and the headset or the audio speaker plays sound.

Figure 2:
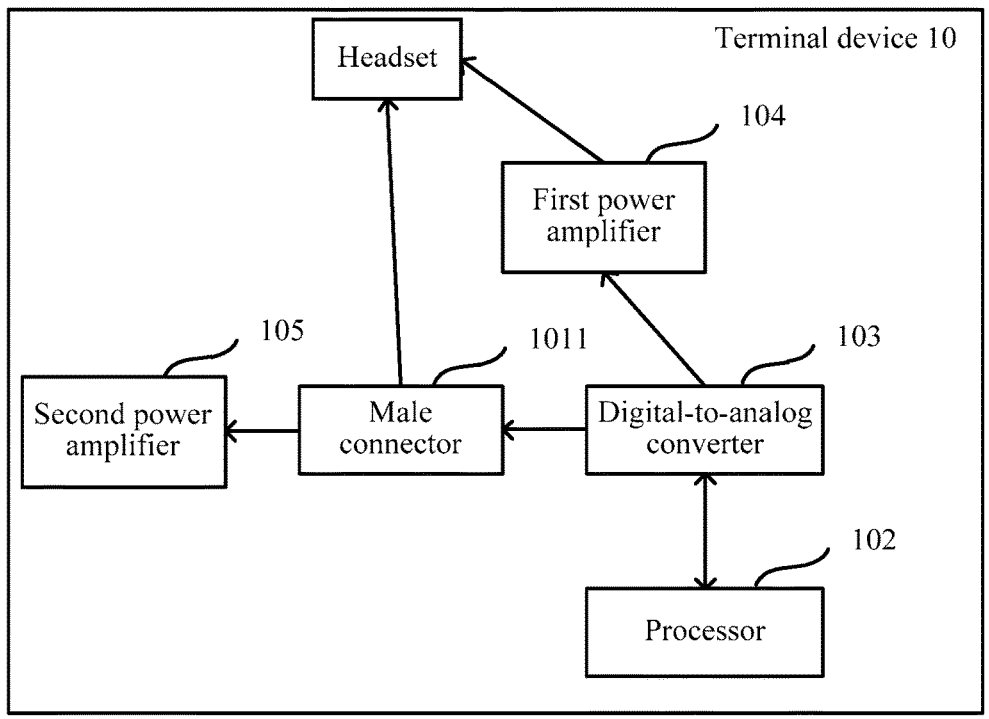
FIG. 2 is a second schematic diagram of a terminal device according to a second embodiment of the present disclosure.

FIG. 2 is a second schematic diagram of a terminal device according to a second embodiment of the present disclosure. In FIG. 2, the access unit 101 is a male connector 1011. The male connector 1011 is provided with pins. Preferably, there are eight pins. The second power amplifier 105 is a pin power amplifier. The pin power amplifier may be any pin power amplifier in the prior art. In this way, a user has more choices when selecting a power amplifier.

Figure 3:
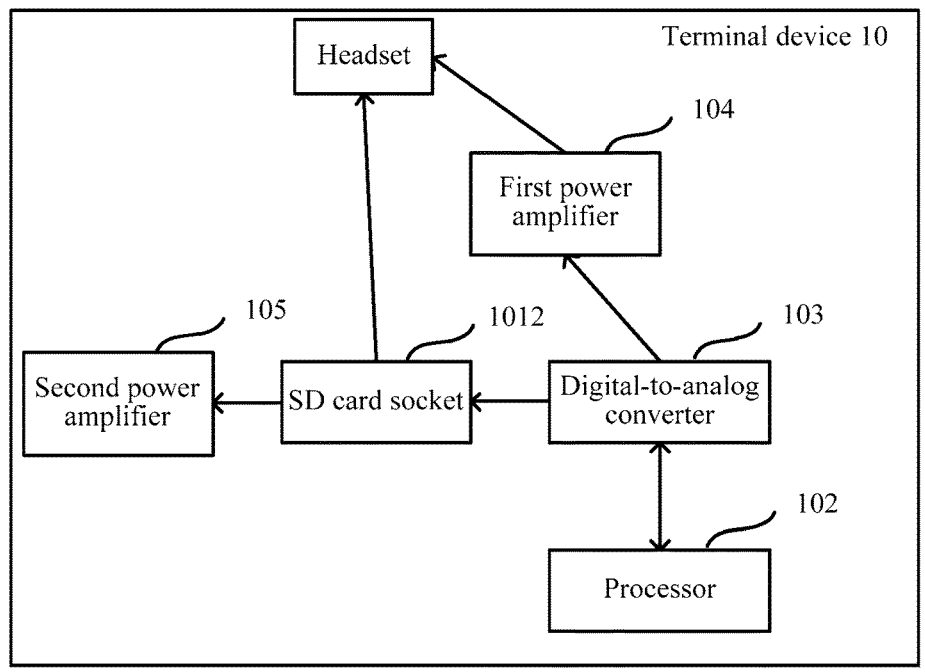
FIG. 3 is a third schematic diagram of a terminal device according to a third embodiment of the present disclosure.

FIG. 3 is a third schematic diagram of a terminal device according to a third embodiment of the present disclosure. In FIG. 3, the access unit 101 is the SD card socket 1012. The SD card socket is also provided with pins. Preferably, there are eight pins. The second power amplifier 105 includes: a substrate, and a power amplifier disposed on the substrate. The power amplifier may be disposed on the substrate by using a surface-mount technology (SMT). Pins on the substrate are connected to the pins on the SD card socket after the substrate is plug-connected to the SD card socket.

It should be noted that in FIG. 3, a size and a shape of the substrate match those of the SD card on the terminal device. Preferably, the pins on the substrate are edge connectors, so that an overall thickness of the terminal device is less than a threshold, and different second power amplifiers 105 are easily removed and replaced.

In addition, a person skilled in the art may design the access unit 101 to be another socket. The socket has a same design structure (such as a pin structure) as the SD card socket.

In FIG. 1, the processor 102 is configured to: detect whether the second power amplifier 105 is inserted into the access unit 101; output a first digital signal when detecting that the second power amplifier 105 is inserted into the access unit 101; and output a second digital signal when detecting that the second power amplifier 105 is not inserted into the access unit 101.

Optionally, when detecting that the second power amplifier 105 is inserted into the access unit 101, the processor 102 is further configured to: receive a second power amplifier selection instruction entered by a user, where the second power amplifier selection instruction is used to trigger the processor 102 to detect a power supply status of the second power amplifier 105; and output the first digital signal when the power supply status of the second power amplifier 105 is a normal state.

Further, the processor 102 is configured to: receive a first power amplifier selection instruction entered by a user, and output the second digital signal according to the first power amplifier selection instruction.

Using the terminal device in FIG. 2 as an example, after the pin power amplifier having eight pins is inserted into the male connector, the pins of the male connector change into a low level, so that an input level collected in a collection period by the processor 102 is low level. When the collected input level is a low level, the processor 102 determines that the pin power amplifier is inserted into the male connector, that is, it is detected that the second power amplifier 105 is inserted into the access unit 101, and the processor 102 outputs the first digital signal. Optionally, when it is detected that the second power amplifier 105 is inserted into the access unit 101, a UI interface may be loaded. A user enters a second power amplifier selection instruction or a first power amplifier selection instruction by using the UI interface. After receiving the second power amplifier selection instruction, the processor 102 detects a power supply status of the second power amplifier 105, that is, detects whether a circuit connection between the second power amplifier 105 and a power supply source is normal. If the circuit connection is normal, the processor 102 outputs the first digital signal. Alternatively, after receiving the first power amplifier selection instruction, the processor 102 outputs the second digital signal according to the first power amplifier selection instruction In FIG. 1, the digital-to-analog converter 103 is connected to the processor 102, and is configured to: when receiving the first digital signal, convert the first digital signal to a first analog signal, and send the first analog signal to the second power amplifier 105; and when receiving the second digital signal, convert the second digital signal to a second analog signal, and send the second analog signal to the first power amplifier 104.

Specifically, when the processor 102 detects that the second power amplifier 105 is inserted into the access unit 101, and receives the second power amplifier selection instruction entered by the user, an audio stream during playback by the headset automatically selects a channel that passes the second power amplifier 105. That is, the processor 102 transmits the first digital signal to the digital-to-analog converter 103, and a first analog signal output by the digital-to-analog converter 103 is transmitted to the second power amplifier 105. The second power amplifier 105 amplifies and sends the received first analog signal to the headset to play. In this case, the first power amplifier 104 is disabled. After the processor 102 detects that the second power amplifier 105 is inserted into the access unit 101, and receives the first power amplifier selection instruction entered by the user, the audio stream during playback by the headset selects by default a channel that passes the first power amplifier 104. That is, the processor 102 transmits the second digital signal to the digital-to-analog converter 103, and a second analog signal output by the digital-to-analog converter 103 is transmitted to the first power amplifier 104, and the first power amplifier 104 amplifies and sends the received second analog signal to the headset to play. In this case, the second power amplifier 105 is disabled.

The terminal device provided in this embodiment of the present disclosure includes: an access unit, a processor, a digital-to-analog converter, a built-in first power amplifier, and a detachable second power amplifier, where the access unit is connected between a headset or an audio speaker and the digital-to-analog converter, and is configured for insertion of the detachable second power amplifier; the processor is configured to detect whether the second power amplifier is inserted into the access unit, output a first digital signal when detecting that the second power amplifier is inserted into the access unit, and output a second digital signal when detecting that the second power amplifier is not inserted into the access unit; and the digital-to-analog converter is connected to the processor, and is configured to: when receiving the first digital signal, convert the first digital signal to a first analog signal, and send the first analog signal to the second power amplifier, and when receiving the second digital signal, convert the second digital signal to a second analog signal, and send the second analog signal to the first power amplifier. In this way, the terminal device may be compatible with multiple PAs, so that users of the terminal device may pair different headsets with different sound sources by themselves, improving user experience.

Figure 4:
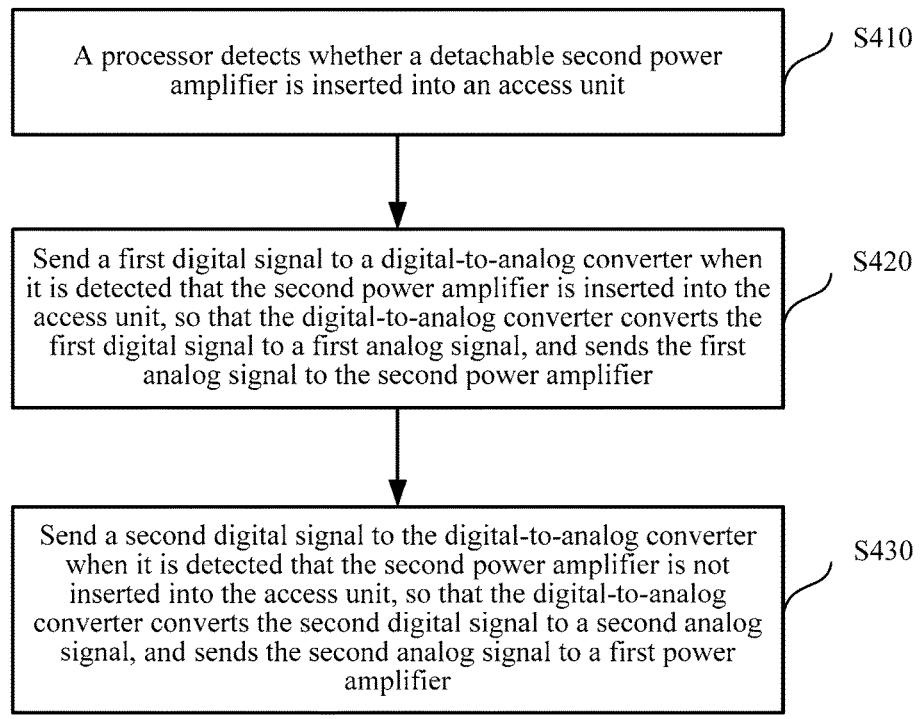
FIG. 4 is a flowchart of a signal sending method according to a fourth embodiment of the present disclosure.

FIG. 4 is a flowchart of a signal sending method according to a fourth embodiment of the present disclosure. The method may be performed by the processor 102 in FIG. 1. As shown in FIG. 4, the method may include the following steps.

Step 410. The processor detects whether a detachable second power amplifier is inserted into an access unit.

The access unit may be a male connector. The male connector is provided with pins. Preferably, there are eight pins. The second power amplifier may be a pin power amplifier.

Alternatively, the access unit may be a secure digital SD card socket. The SD card socket is provided with pins. Preferably, there are eight pins. The second power amplifier includes: a substrate, and a power amplifier disposed on the substrate by using a surface-mount technology SMT. Pins on the substrate are connected to the pins on the SD card socket after the substrate is plug-connected to the SD card socket. Preferably, the pins on the substrate are edge connectors.

Step 420. Send a first digital signal to a digital-to-analog converter when it is detected that the second power amplifier is inserted into the access unit, so that the digital-to-analog converter converts the first digital signal to a first analog signal, and sends the first analog signal to the second power amplifier.

Step 430. Send a second digital signal to the digital-to-analog converter when it is detected that the second power amplifier is not inserted into the access unit, so that the digital-to-analog converter converts the second digital signal to a second analog signal, and sends the second analog signal to a first power amplifier.

Optionally, when it is detected that the second power amplifier is inserted into the access unit, the method further includes:

receiving a second power amplifier selection instruction entered by a user, where the second power amplifier selection instruction is used to trigger the processor to detect a power supply status of the second power amplifier; and sending the first digital signal to the digital-to-analog converter when the power supply status of the second power amplifier is a normal state.

Optionally, the method further includes:

receiving a first power amplifier selection instruction entered by a user, and sending the second digital signal to the digital-to-analog converter according to the first power amplifier selection instruction.

The signal sending method provided in this embodiment of the present disclosure includes: detecting, by a processor, whether a detachable second power amplifier is inserted into an access unit; sending a first digital signal to a digital-to-analog converter when it is detected that the second power amplifier is inserted into the access unit, so that the digital-to-analog converter converts the first digital signal to a first analog signal, and sends the first analog signal to the second power amplifier; and sending a second digital signal to the digital-to-analog converter when it is detected that the second power amplifier is not inserted into the access unit, so that the digital-to-analog converter converts the second digital signal to a second analog signal, and sends the second analog signal to the first power amplifier. In this way, the terminal device may be compatible with multiple PAs, so that users of the terminal device may pair different headsets with different sound sources by themselves, improving user experience.

Figure 5:
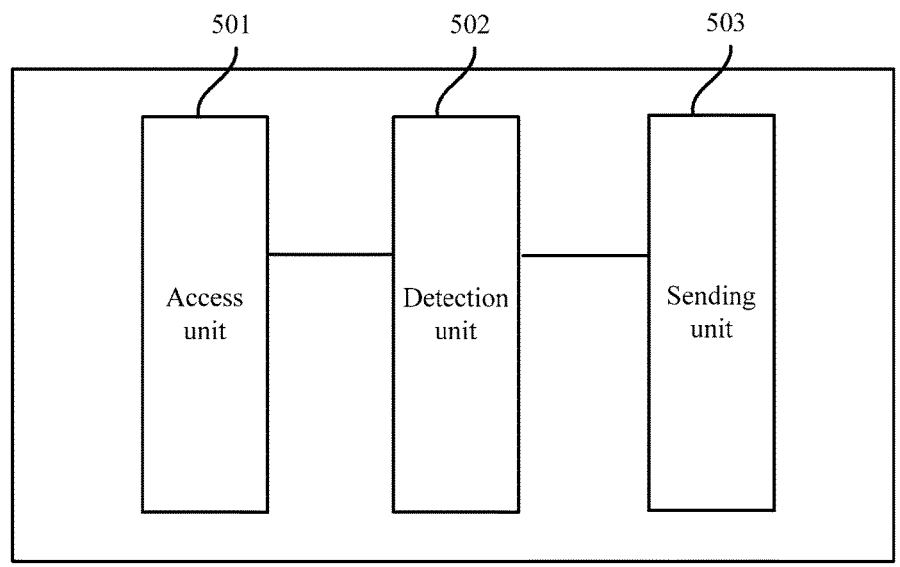
FIG. 5 is a schematic diagram of a signal sending apparatus according to a fifth embodiment of the present disclosure.

FIG. 5 is a schematic diagram of a signal sending apparatus according to a fifth embodiment of the present disclosure. In FIG. 5, the apparatus includes: an access unit 501, a detection unit 502, and a sending unit 503.

The access unit 501 is configured for insertion of a detachable second power amplifier.

Optionally, the access unit 501 is a male connector, the male connector is provided with pins, and the second power amplifier is a pin power amplifier.

Optionally, the access unit 501 is a secure digital SD card socket. The SD card socket is provided with pins. The second power amplifier includes: a substrate, and a power amplifier disposed on the substrate. Pins on the substrate are connected to the pins on the SD card socket after the substrate is plug-connected to the SD card socket.

Further, the power amplifier is disposed on the substrate by using a surface-mount technology SMT. The pins of the substrate are edge connectors.

The detection unit 502 is configured to detect whether the detachable second power amplifier is inserted into the access unit 501.

The sending unit 503 is configured to send a first digital signal to a digital-to-analog converter when the detection unit 502 detects that the second power amplifier is inserted into the access unit 501, so that the digital-to-analog converter converts the first digital signal to a first analog signal, and sends the first analog signal to the second power amplifier.

The sending unit 503 is further configured to send a second digital signal to the digital-to-analog converter when the detection unit 502 detects that the second power amplifier is not inserted into the access unit 501, so that the digital-to-analog converter converts the second digital signal to a second analog signal, and sends the second analog signal to a first power amplifier.

Optionally, the apparatus further includes: a receiving unit 504, configured to: receive a second power amplifier selection instruction entered by a user, where the second power amplifier selection instruction is used to trigger the detection unit 502 to detect a power supply status of the second power amplifier; and send the first digital signal to the digital-to-analog converter when the power supply status of the second power amplifier is a normal state.

The receiving unit 504 is further configured to: receive a first power amplifier selection instruction entered by a user, and send the second digital signal to the digital-to-analog converter according to the first power amplifier selection instruction.

The method provided in the method embodiment of the present disclosure is embedded in the apparatus provided in the apparatus embodiment of the present disclosure. Therefore, a specific operating process of the apparatus provided in the present disclosure is not described herein.

In this way, the signal sending apparatus provided in this embodiment of the present disclosure may be compatible with multiple PAs, so that mobile phone users may pair different headsets with sound sources, improving user experience.

Figure 6:
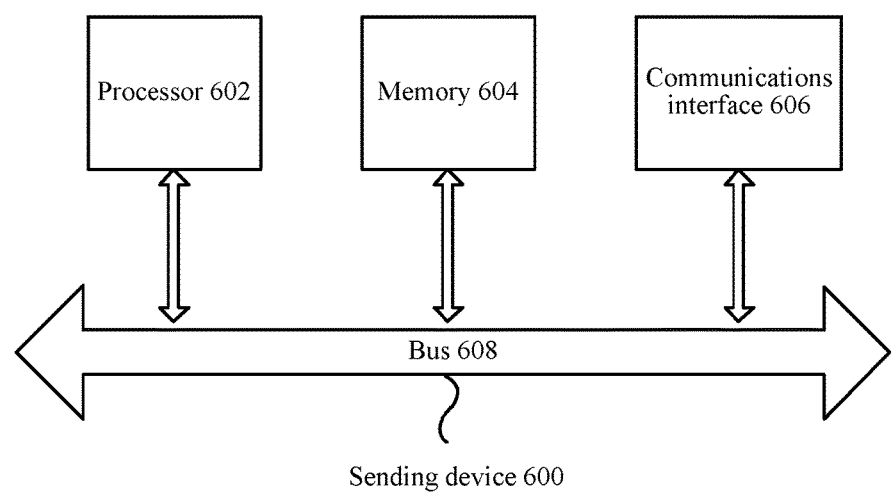
FIG. 6 is a schematic diagram of a signal sending device according to a sixth embodiment of the present disclosure.

FIG. 6 is a schematic diagram of a signal sending device according to a sixth embodiment of the present disclosure. In FIG. 6, the sending device 600 includes: a processor 602, a memory 604, a communications interface 606, and a bus 608. The processor 602, the memory 604, and the communications interface 606 communicate with each other by using the bus 608.

The processor 602 may use a general-purpose central processing unit (CPU), a microprocessor, an application-specific integrated circuit (ASIC), or one or more integrated circuits to execute a related program, to implement the technical solution provided in the fourth embodiment of the present disclosure.

The memory 604 may be a read-only memory (ROM), a static storage device, a dynamic storage device, or a random access memory (RAM). The memory 604 may store an operating system and another application program. When the technical solution provided in this embodiment of the present disclosure is implemented by using software or firmware, program code for implementing the technical solution provided in this embodiment of the present disclosure is stored in the memory 604, and is executed by the processor 602.

The communications interface 606 is configured to communicate with another device.

The bus 608 may include a channel for transmitting information among each element (such as the processor 602, the memory 604, and the communications interface 606) of the sending device 600.

When the sending device 600 is running, the program code in the memory 604 is accessed by the processor 602, to execute the following instruction:

detecting whether a detachable second power amplifier is inserted into an access unit;

sending a first digital signal to a digital-to-analog converter when detecting that the second power amplifier is inserted into the access unit, so that the digital-to-analog converter converts the first digital signal to a first analog signal, and sends the first analog signal to the second power amplifier; and sending a second digital signal to the digital-to-analog converter when detecting that the second power amplifier is not inserted into the access unit, so that the digital-to-analog converter converts the second digital signal to a second analog signal, and sends the second analog signal to a first power amplifier.

Further, the 602 processor is further configured to execute an instruction having the following process:

receiving a second power amplifier selection instruction entered by a user, where the second power amplifier selection instruction is used to trigger the processor to detect a power supply status of the second power amplifier; and sending the first digital signal to the digital-to-analog converter when the power supply status of the second power amplifier is a normal state.

Further, the 602 processor is configured to execute an instruction having the following process:

receiving a first power amplifier selection instruction entered by a user, and sending the second digital signal to the digital-to-analog converter according to the first power amplifier selection instruction.

Optionally, the access unit is a male connector, the male connector is provided with pins, and the second power amplifier is a pin power amplifier.

Optionally, the access unit is a secure digital SD card socket. The SD card socket is provided with pins. The second power amplifier includes: a substrate, and a power amplifier disposed on the substrate. Pins on the substrate are connected to the pins on the SD card socket after the substrate is plug-connected to the SD card socket.

The power amplifier is disposed on the substrate by using a surface-mount technology SMT. The pins of the substrate are edge connectors.

In this way, the signal sending device provided in this embodiment of the present disclosure may be compatible with multiple PAs, so that mobile phone users may pair different headsets with sound sources, improving user experience.

A person skilled in the art may be further aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

Steps of methods or algorithms described in the embodiments disclosed in this specification may be implemented by hardware, a software module executed by a processor, or a combination thereof. The software module may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

In the foregoing specific implementation manners, the objective, technical solutions, and benefits of the present disclosure are further described in detail. It should be understood that the foregoing descriptions are merely specific implementation manners of the present disclosure, but are not intended to limit the protection scope of the present disclosure. Any modification, equivalent replacement, or improvement made without departing from the spirit and principle of the present disclosure should fall within the protection scope of the present disclosure.

What is claimed is:

1. A terminal device, comprising:
an access unit,
a processor,
a digital-to-analog converter,
a built-in first power amplifier, and
a detachable second power amplifier;
wherein the access unit is connected between a headset or an audio speaker and the digital-to-analog converter, and is configured for insertion of the detachable second power amplifier;
wherein the processor is configured to: detect whether the second power amplifier is inserted into the access unit; output a first digital signal when detecting that the second power amplifier is inserted into the access unit; and output a second digital signal when detecting that the second power amplifier is not inserted into the access unit; and
wherein the digital-to-analog converter is connected to the processor, and is configured to: when receiving the first digital signal, convert the first digital signal to a first analog signal, and send the first analog signal to the second power amplifier; and when receiving the second digital signal, convert the second digital signal to a second analog signal, and send the second analog signal to the first power amplifier.

2. The terminal device according to claim 1, wherein when detecting that the second power amplifier is inserted into the access unit, the processor is further configured to:
receive a second power amplifier selection instruction entered by a user, wherein the second power amplifier selection instruction is used to trigger the processor to detect a power supply status of the second power amplifier; and
output the first digital signal when the power supply status of the second power amplifier is a normal state.

3. The terminal device according to claim 1, wherein the processor is further configured to:
receive a first power amplifier selection instruction entered by a user; and
output the second digital signal according to the first power amplifier selection instruction.

4. The terminal device according to claim 1, wherein the access unit is a male connector, the male connector is provided with pins, and the second power amplifier is a pin power amplifier.

5. The terminal device according to claim 1,
wherein the access unit is a secure digital (SD) card socket, wherein the SD card socket is provided with pins; and
wherein the second power amplifier comprises: a substrate, and a power amplifier circuit disposed on the substrate, wherein pins on the substrate of the second power amplifier are connected to the pins on the SD card socket after the substrate is plug-connected to the SD card socket.

6. The terminal device according to claim 5, wherein the power amplifier is disposed on the substrate of the second power amplifier by using a surface-mount technology (SMT), wherein the pins on the substrate are edge connectors.

7. A signal sending method, comprising:
detecting, by a processor, whether a detachable second power amplifier is inserted into an access unit;
sending a first digital signal to a digital-to-analog converter in response to detecting that the second power amplifier is inserted into the access unit, so that the digital-to-analog converter converts the first digital signal to a first analog signal, and sends the first analog signal to the second power amplifier; and
sending a second digital signal to the digital-to-analog converter in response to detecting that the second power amplifier is not inserted into the access unit, so that the digital-to-analog converter converts the second digital signal to a second analog signal, and sends the second analog signal to a first power amplifier.

8. The method according to claim 7, wherein in response to detecting that the second power amplifier is inserted into the access unit, the method further comprises:
receiving a second power amplifier selection instruction entered by a user, wherein the second power amplifier selection instruction is used to trigger the processor to detect a power supply status of the second power amplifier; and
sending the first digital signal to the digital-to-analog converter when the power supply status of the second power amplifier is a normal state.

9. The method according to claim 7, further comprising:
receiving a first power amplifier selection instruction entered by a user, and sending the second digital signal to the digital-to-analog converter according to the first power amplifier selection instruction.

10. The method according to claim 7, wherein the access unit is a male connector, the male connector is provided with pins, and the second power amplifier is a pin power amplifier.

11. The method according to claim 7,
wherein the access unit is a secure digital (SD) card socket, wherein the SD card socket is provided with pins; and
wherein the second power amplifier comprises: a substrate, and a power amplifier disposed on the substrate, wherein pins on the substrate of the second power amplifier are connected to the pins on the SD card socket after the substrate is plug-connected to the SD card socket.

12. The method according to claim 11, wherein the power amplifier is disposed on the substrate of the second power amplifier by using a surface-mount technology (SMT), wherein the pins on the substrate are edge connectors.

13. A signal sending device, comprising:
a memory configured to store a program; and
a processor is configured to execute the program stored in the memory to perform:
detecting, by the processor, whether a detachable second power amplifier is inserted into an access unit;
sending a first digital signal to a digital-to-analog converter in response to detecting that the second power amplifier is inserted into the access unit, so that the digital-to-analog converter converts the first digital signal to a first analog signal, and sends the first analog signal to the second power amplifier; and
sending a second digital signal to the digital-to-analog converter in response to detecting that the second power amplifier is not inserted into the access unit, so that the digital-to-analog converter converts the second digital signal to a second analog signal, and sends the second analog signal to a first power amplifier.

14. The signal sending device according to claim 13, wherein when detecting that the second power amplifier is inserted into the access unit, the processor is further configured to:
receive a second power amplifier selection instruction entered by a user, wherein the second power amplifier selection instruction is used to trigger the processor to detect a power supply status of the second power amplifier; and
output the first digital signal when the power supply status of the second power amplifier is a normal state.

15. The signal sending device according to claim 13, wherein the processor is further configured to:
receive a first power amplifier selection instruction entered by a user; and
output the second digital signal according to the first power amplifier selection instruction.

16. The signal sending device according to claim 13, wherein the access unit is a male connector, the male connector is provided with pins, and the second power amplifier is a pin power amplifier.

17. The signal sending device according to claim 13,
wherein the access unit is a secure digital (SD) card socket, wherein the SD card socket is provided with pins; and
wherein the second power amplifier comprises: a substrate, and a power amplifier circuit disposed on the substrate, wherein pins on the substrate of the second power amplifier are connected to the pins on the SD card socket after the substrate is plug-connected to the SD card socket.

18. The signal sending device according to claim 17, wherein the power amplifier is disposed on the substrate of the second power amplifier by using a surface-mount technology (SMT), wherein the pins on the substrate are edge connectors.

* * * * *